United States Patent
Lin et al.

(10) Patent No.: US 11,205,647 B2
(45) Date of Patent: Dec. 21, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Shih-Yao Lin, New Taipei (TW); Kuei-Yu Kao, Hsinchu (TW); Chi-Sheng Lai, Hsinchu (TW); Chih-Han Lin, Hsinchu (TW); Wei-Chung Sun, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 22 days.

(21) Appl. No.: 16/780,068

(22) Filed: Feb. 3, 2020

(65) Prior Publication Data

US 2020/0411514 A1 Dec. 31, 2020

Related U.S. Application Data

(60) Provisional application No. 62/868,083, filed on Jun. 28, 2019.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823468* (2013.01); *H01L 21/823481* (2013.01); *H01L 29/0649* (2013.01); *H01L 29/6656* (2013.01); *H01L 29/66545* (2013.01); *H01L 29/66818* (2013.01)

(58) Field of Classification Search
CPC .......... H01L 27/0886; H01L 27/1211; H01L 21/823481; H01L 21/823468; H01L 21/845; H01L 21/823431; H01L 29/6656; H01L 29/66545; H01L 29/66818; H01L 29/0649; H01L 29/6653
USPC ............ 257/368, 369, 401, 408, 346, 365, 257/E29.242, E29.264, E29.255, E21.214, 257/E21.235, E21.421, E21.255, E27.112, 257/E27.06; 438/275, 283, 696, 595
See application file for complete search history.

(56) References Cited

U.S. PATENT DOCUMENTS

| 8,487,378 B2 | 7/2013 | Goto et al. |
| 8,729,634 B2 | 5/2014 | Shen et al. |

(Continued)

FOREIGN PATENT DOCUMENTS

| KR | 20140141258 A | 12/2014 |
| KR | 20150008304 A | 1/2015 |

(Continued)

*Primary Examiner* — Dao H Nguyen
(74) *Attorney, Agent, or Firm* — Slater Matsil, LLP

(57) ABSTRACT

A semiconductor device and method are provided whereby a series of spacers are formed in a first region and a second region of a substrate. The series of spacers in the first region are patterned while the series of spacers in the second region are protected in order to separate the properties of the spacers in the first region from the properties of the spacers in the second region.

20 Claims, 12 Drawing Sheets

(51) Int. Cl.
    *H01L 29/66*     (2006.01)
    *H01L 29/06*     (2006.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 8,981,481 B2 | 3/2015 | Hafez et al. |
| 9,490,177 B2 | 11/2016 | Oh et al. |
| 9,647,116 B1 | 5/2017 | Lee et al. |
| 10,319,832 B2 | 6/2019 | Li et al. |
| 10,714,592 B2 | 7/2020 | Cheng et al. |
| 10,784,377 B2 | 9/2020 | Chan et al. |
| 2014/0282326 A1 | 9/2014 | Chen et al. |
| 2014/0353719 A1 | 12/2014 | Kim |
| 2015/0014788 A1 | 1/2015 | Park et al. |
| 2016/0365446 A1* | 12/2016 | Chang .................. H01L 29/7845 |
| 2017/0194210 A1* | 7/2017 | Oh ..................... H01L 21/02282 |
| 2017/0200803 A1* | 7/2017 | Lee ....................... H01L 29/511 |
| 2017/0221893 A1* | 8/2017 | Tak ..................... H01L 29/0665 |
| 2017/0330953 A1* | 11/2017 | Mulfinger ........ H01L 21/823864 |
| 2021/0083067 A1* | 3/2021 | Wang ................ H01L 21/76897 |

FOREIGN PATENT DOCUMENTS

| | | |
|---|---|---|
| KR | 20170091432 A | 8/2017 |
| TW | 201344886 A | 11/2013 |
| TW | 201631740 A | 9/2016 |
| TW | 201715726 A | 5/2017 |
| TW | 201843716 A | 12/2018 |
| TW | 201916121 A | 4/2019 |
| TW | 201917780 A | 5/2019 |

* cited by examiner

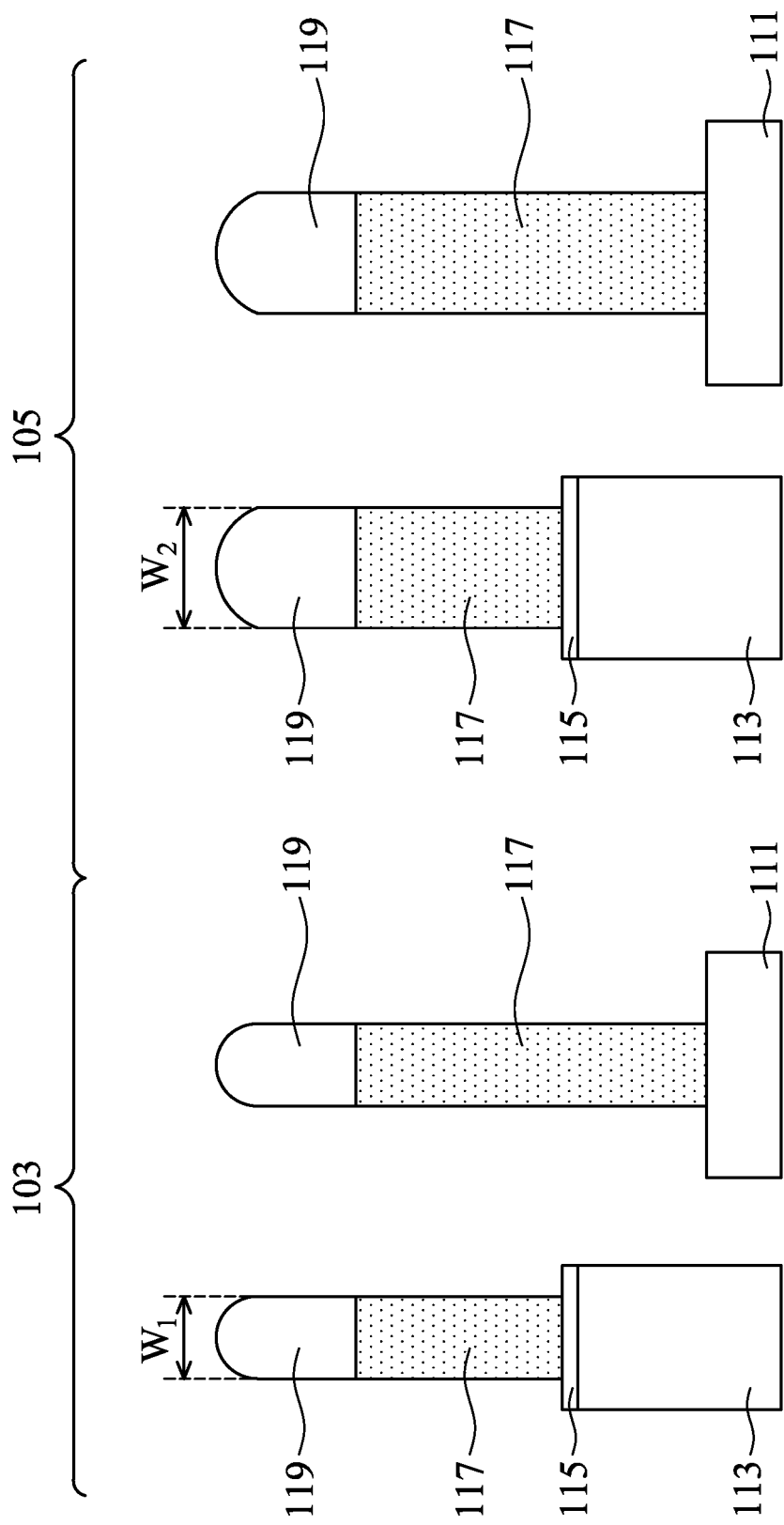

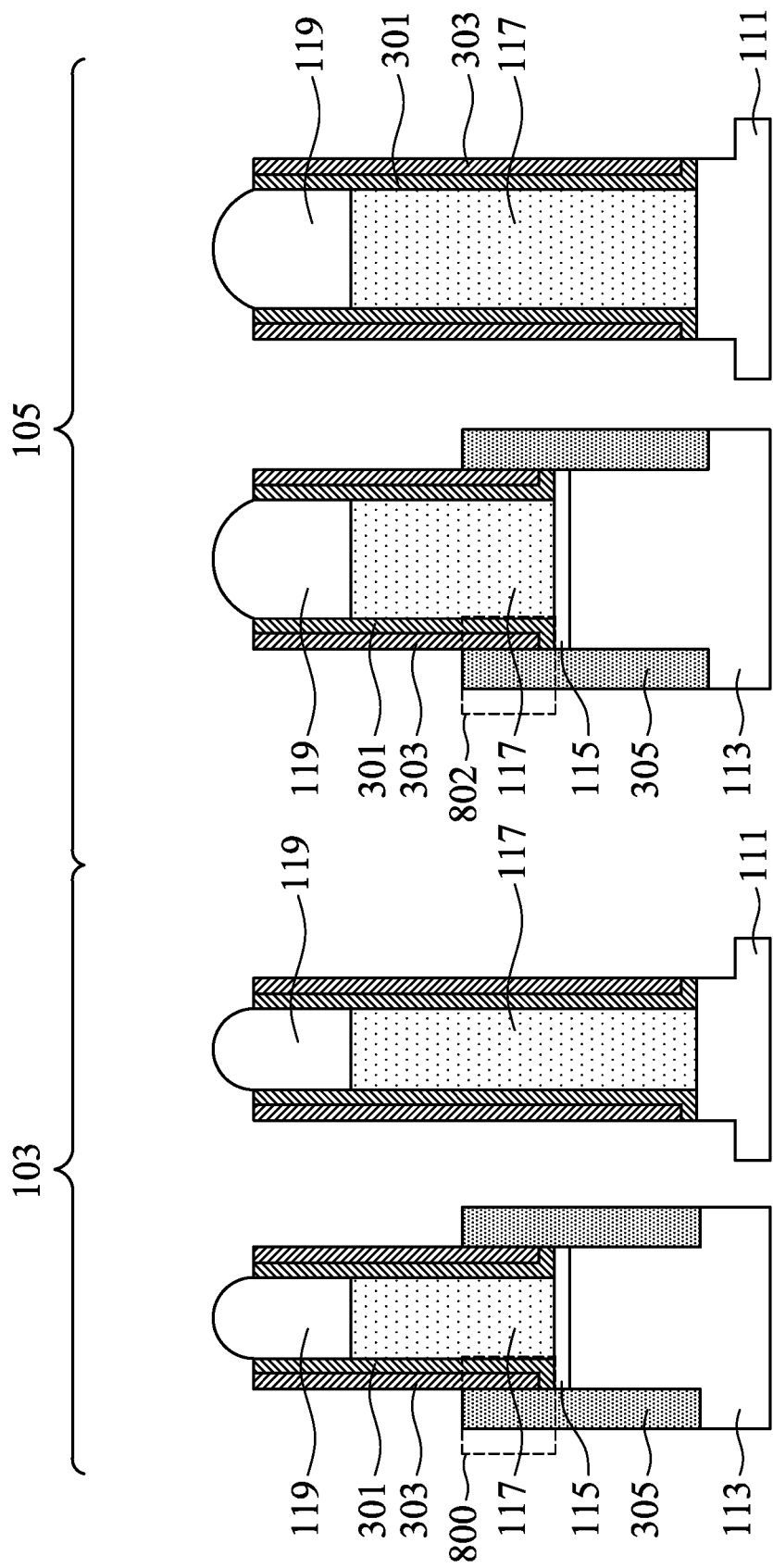

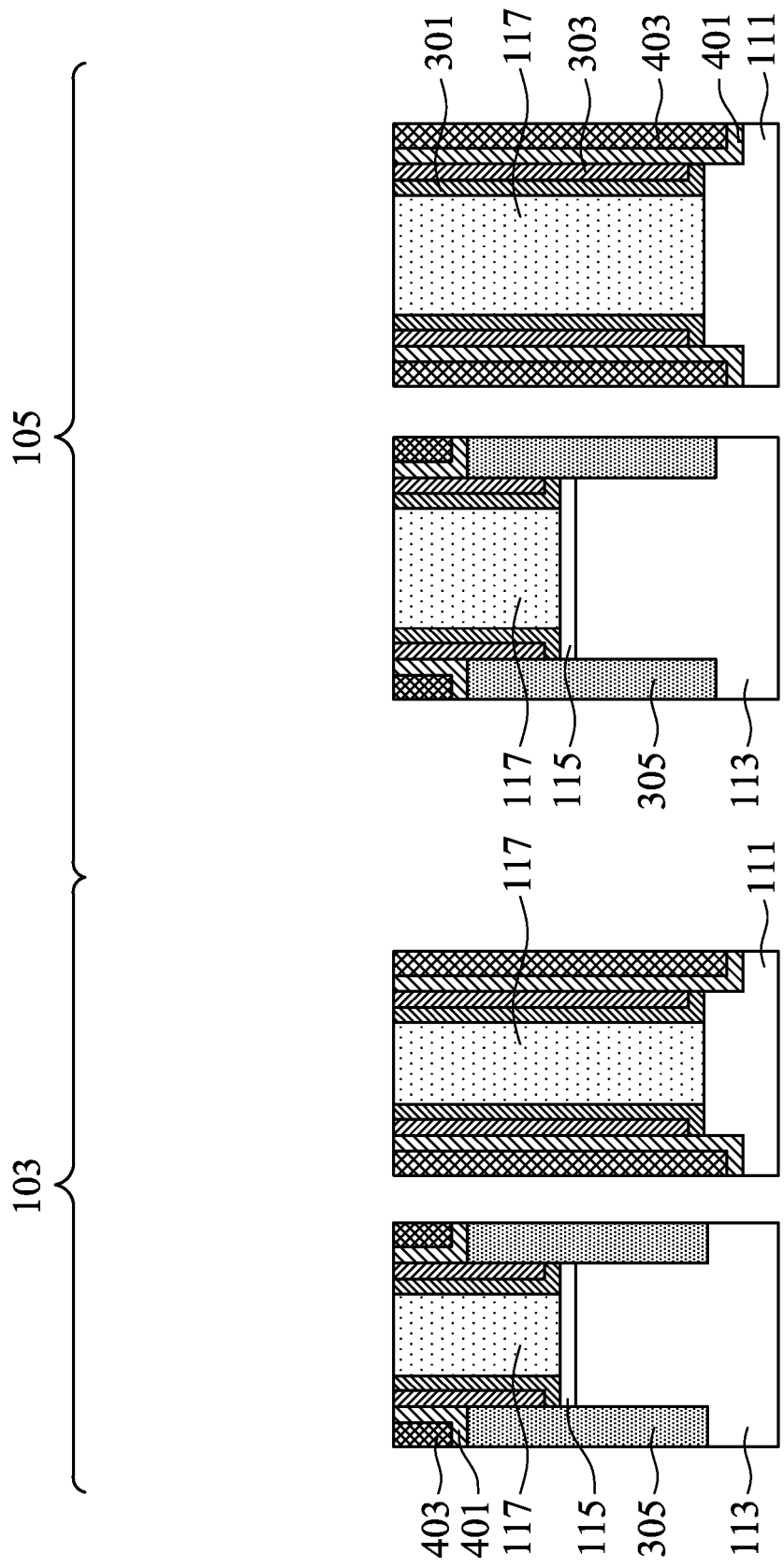

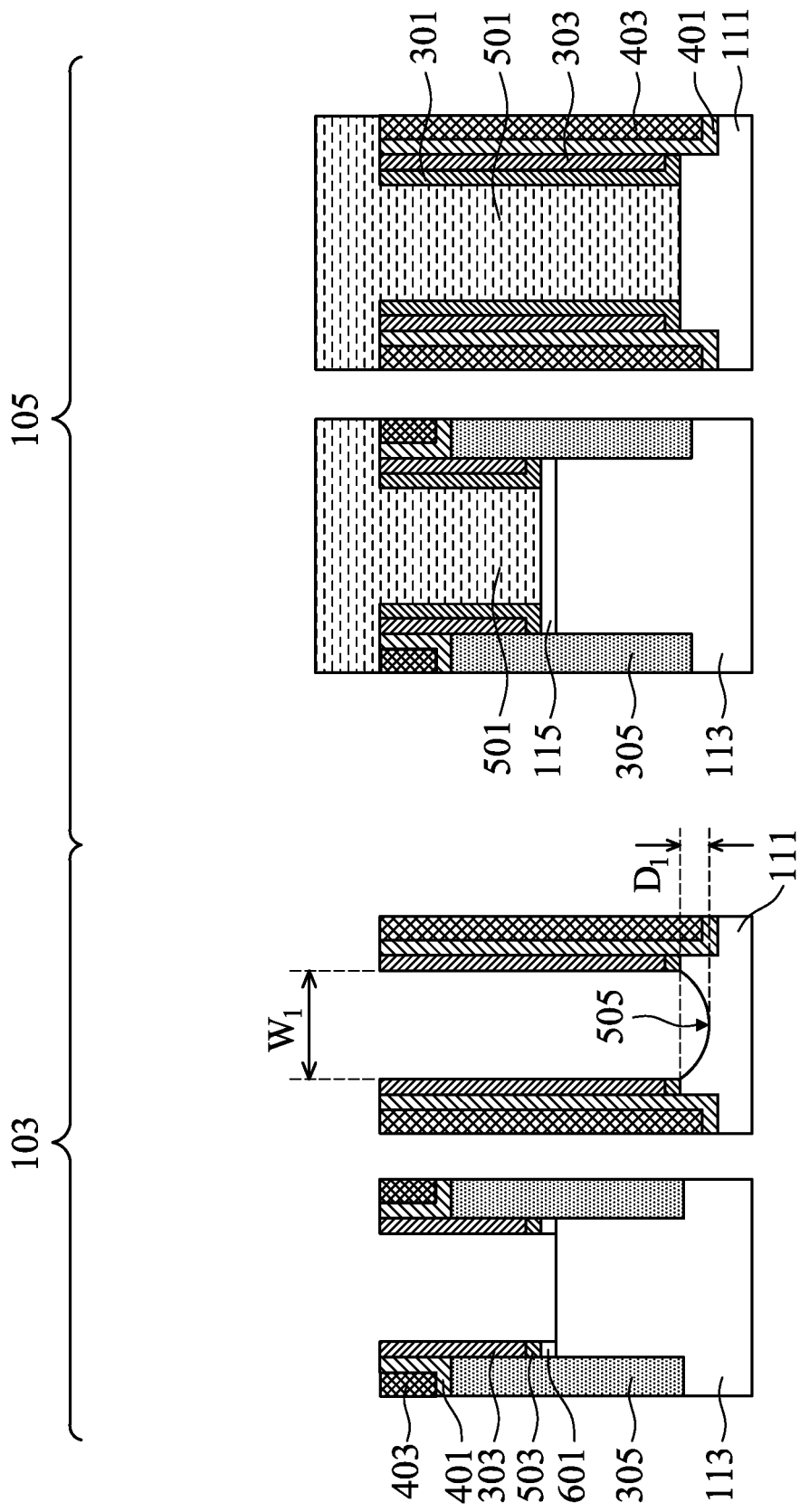

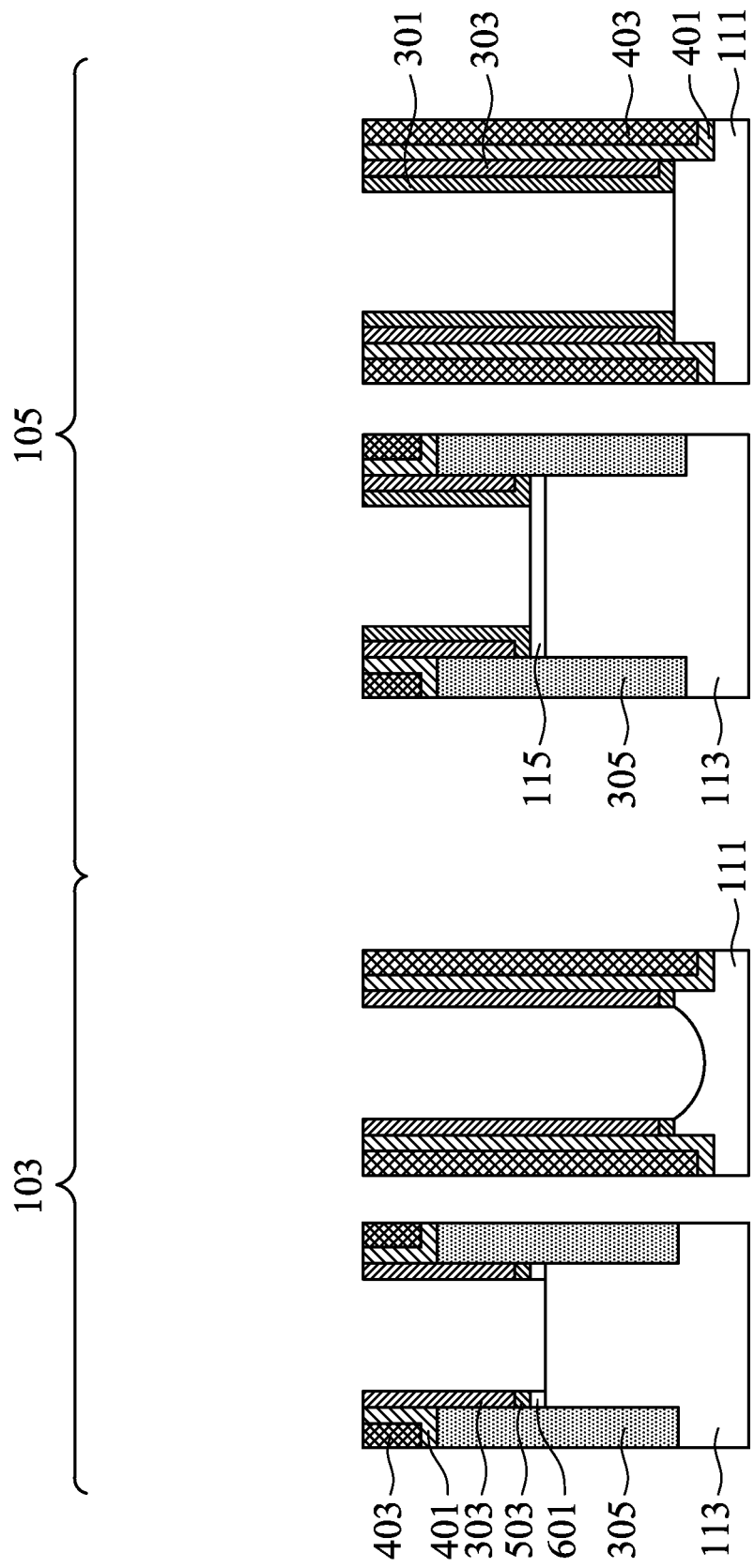

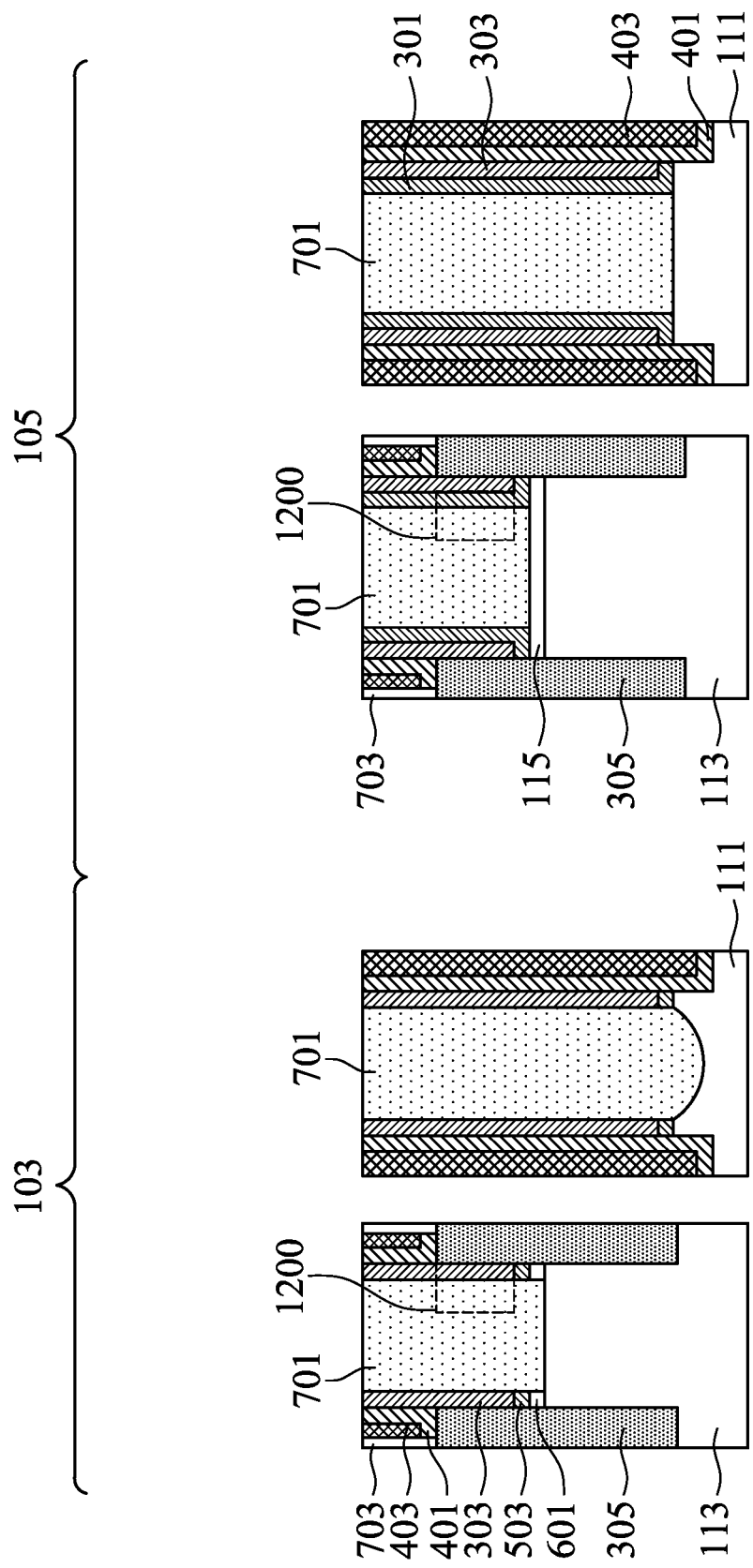

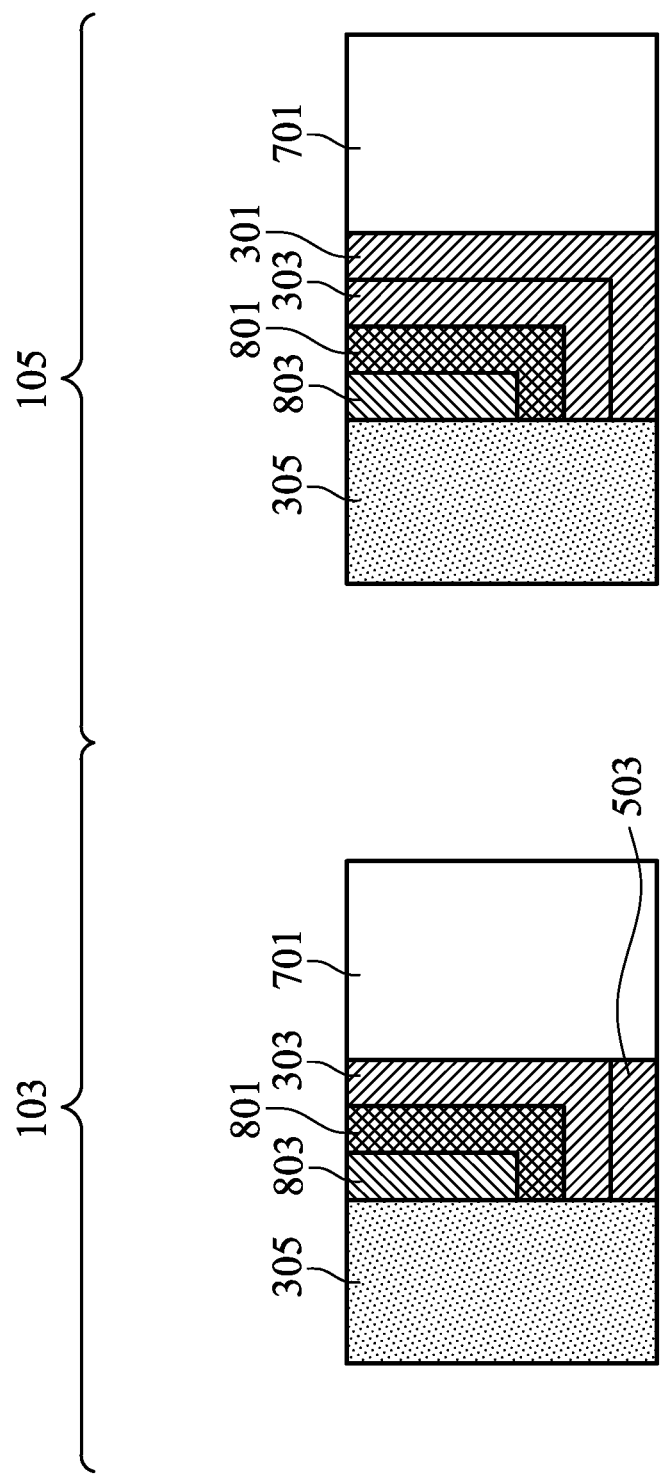

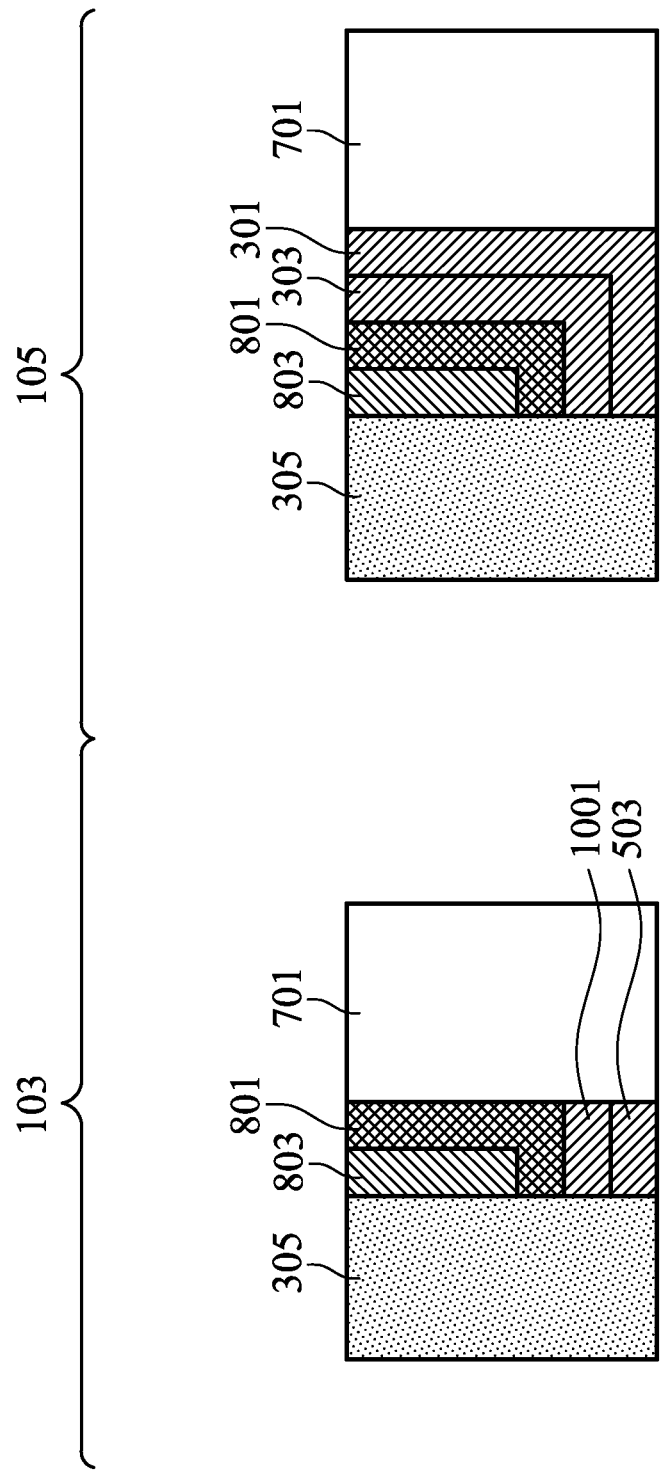

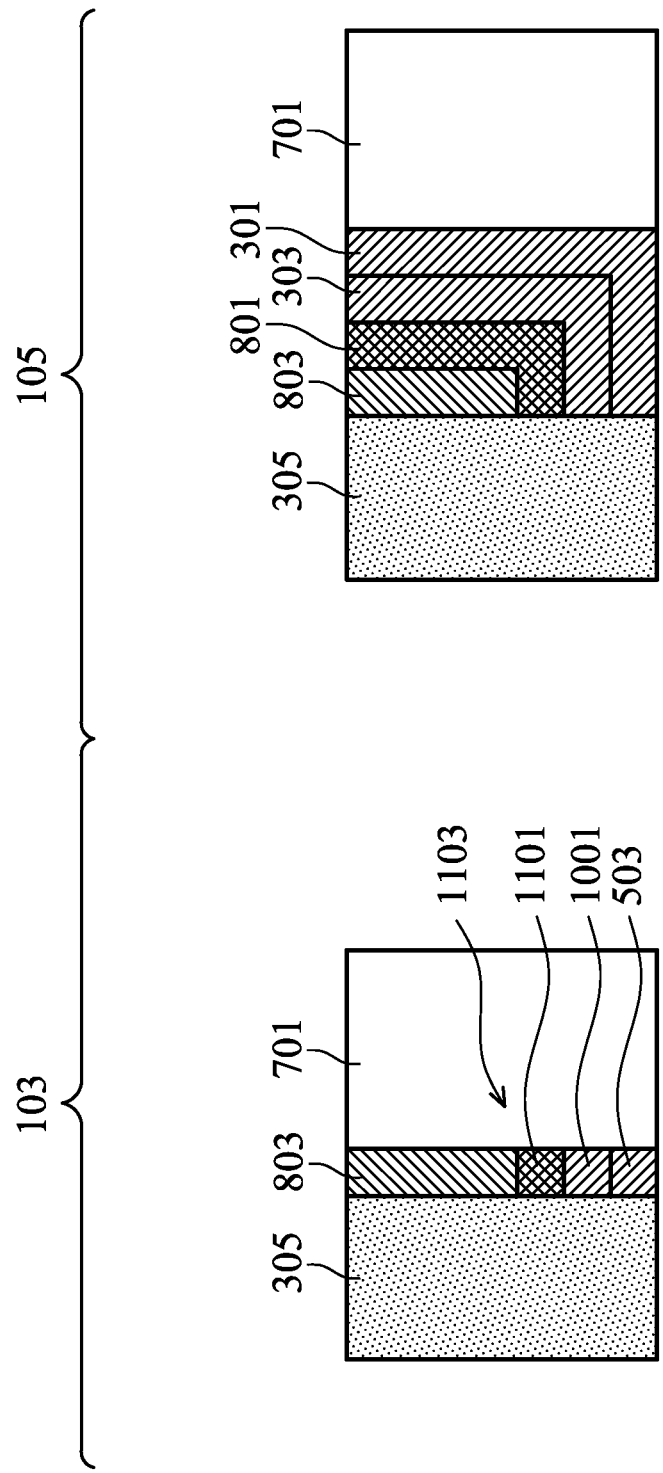

SEMICONDUCTOR DEVICE AND METHOD OF MANUFACTURE

PRIORITY CLAIM AND CROSS-REFERENCE

This application claims the benefit of U.S. Provisional Application No. 62/868,083, filed on Jun. 28, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D illustrate cross-sectional view of the core region and the I/O region, in accordance with some embodiments.

FIGS. 3A-3D illustrate formation of spacers, in accordance with some embodiments.

FIGS. 4A-4D illustrate formation of an interlayer dielectric, in accordance with some embodiments.

FIGS. 5A-5D illustrate a patterning of the spacers, in accordance with some embodiments.

FIGS. 6A-6D illustrate a dielectric removal, in accordance with some embodiments.

FIGS. 7A-7D illustrate formation of gate stacks, in accordance with some embodiments.

FIGS. 9A-9B illustrate a first patterning of the four spacers, in accordance with some embodiments.

FIGS. 10A-10B illustrate a second patterning of the four spacers, in accordance with some embodiments.

FIGS. 11A-11B illustrate a third patterning of the four spacers to form a pile of spacers, in accordance with some embodiments.

DETAILED DESCRIPTION

Figure 1:
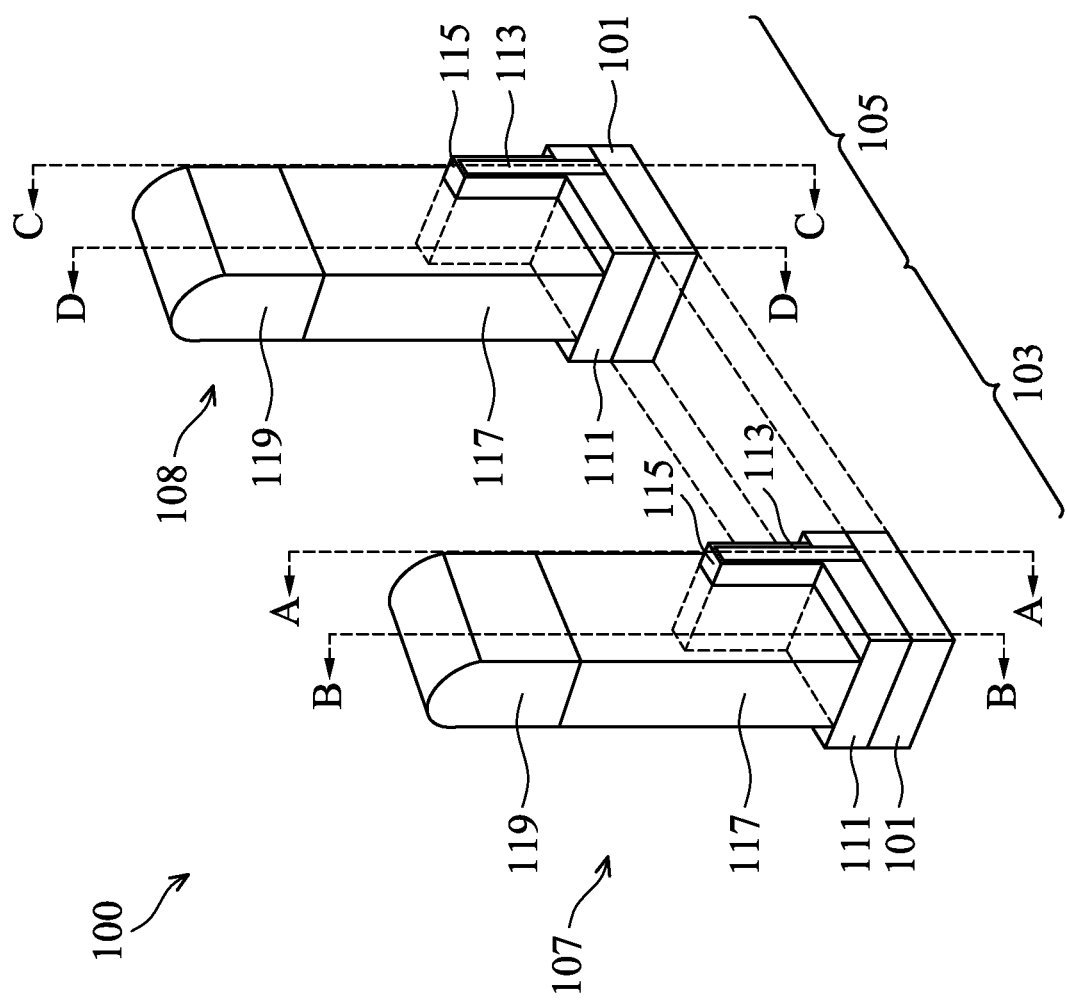
FIG. 1 illustrates a semiconductor substrate with a core region and an I/O region, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures, such as FinFET devices at the sixteen nanometer and beyond technical generations. Embodiments, however, are not so limited and may be utilized in a wide variety of applications beyond those specifically discussed below.

With reference now to FIG. 1, there is illustrated a perspective view of a semiconductor device 100 with a substrate 101 (shown as discontinuous in FIG. 1 for clarity but generally continuous as a semiconductor wafer) that has a core region 103 and an I/O region 105. Within the core region 103 devices may be connected to a first voltage source (e.g., a first high voltage) and a first ground (e.g., a first low voltage source) and may comprise logic devices, memory devices, combinations of these, or the like, which are utilized to perform the desired functions of the semiconductor device 100. Within the I/O region 105 devices may be connected to a second voltage source (e.g., a second high voltage) different from the first voltage source (e.g., a higher voltage source) and a second ground (e.g., a second low voltage source) either the same as or different from the first ground, and may comprise devices utilized to transmit and receive signals into and out of the semiconductor device 100. However, any suitable regions and any suitable functionalities may be utilized.

The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device.

Within the core region 103 a plurality of first fin field effect transistors (FinFET) 107 is formed, with only one such device being illustrated in FIG. 1 for clarity. In devices formed in the core region 103, fewer fins may be implemented to form a respective transistor, and a spacing between neighboring gates (and hence, a width of an intervening source/drain region) may be smaller than other regions (e.g., the I/O region 105).

Within the I/O region 105 a plurality of second FinFETs 108 is formed, with only one such device being illustrated in FIG. 1 for clarity. In devices formed within the I/O region 105, more fins may be implemented to form a respective transistor, and a spacing between neighboring gates (and hence, a width of an intervening source/drain region) may be larger than other regions (e.g., the core region 103). Structures in the I/O region 105 may be formed simultaneously as the corresponding structures in the core region 103.

Portions of the substrate 101 may be removed as an initial step in the eventual formation of first isolation regions 111. The portions of the substrate 101 may be removed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed.

As one of skill in the art will recognize, however, the processes and materials described above to form the masking layer are not the only method that may be used to protect portions of the substrate 101 while exposing other portions of the substrate 101. Any suitable process, such as a patterned and developed photoresist, may be utilized to expose portions of the substrate 101 to be removed. All such methods are fully intended to be included in the scope of the present embodiments.

Once a masking layer has been formed and patterned, the portions of the substrate 101 may be removed. The exposed substrate 101 may be removed through a suitable process such as reactive ion etching (RIE) in order to remove the portions of the substrate 101, although any suitable process may be used. In an embodiment, the portions of the substrate 101 may be removed to a first depth of less than about 5,000 Å from the surface of the substrate 101, such as about 2,500 Å.

However, as one of ordinary skill in the art will recognize, the process described above is merely one potential process, and is not meant to be the only embodiment. Rather, any suitable process through which the portions of the substrate 101 may be removed may be utilized and any suitable process, including any number of masking and removal steps may be used.

Additionally, the masking and etching process additionally forms fins 113 from those portions of the substrate 101 that remain unremoved. For convenience the fins 113 have been illustrated in the figures as being separated from the substrate 101, although a physical indication of the separation may or may not be present. These fins 113 may be used, as discussed below, to form the channel region of multiple-gate FinFET transistors. While FIG. 1 only illustrates two fins 113 formed from the substrate 101, any number of fins 113 may be utilized.

The fins 113 may be formed such that they have a width at the surface of the substrate 101 of between about 5 nm and about 80 nm, such as about 30 nm. Furthermore, the fins 113 may be patterned by any suitable method. For example, the fins 113 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 113.

Once the fins 113 have been formed, a dielectric material may be deposited and the dielectric material may be recessed to form the first isolation regions 111. The dielectric material may be an oxide material, a high-density plasma (HDP) oxide, or the like. The dielectric material may be formed, after optional cleaning and lining steps, using either a chemical vapor deposition (CVD) method (e.g., the HARP process), a high density plasma CVD method, or other suitable method of formation as is known in the art.

The deposition process may fill or overfill the regions around the fins 113 and then excess material may be removed from over the fins 113 through a suitable process such as chemical mechanical polishing (CMP), an etch, a combination of these, or the like. In an embodiment, the removal process removes any dielectric material that is located over the fins 113 as well, so that the removal of the dielectric material will expose the surface of the fins 113 to further processing steps.

Once planarized, the dielectric material may then be recessed away from the surface of the fins 113. The recessing may be performed to expose at least a portion of the sidewalls of the fins 113 adjacent to the top surface of the fins 113. The dielectric material may be recessed using a wet etch by dipping the top surface of the fins 113 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 113 of between about 50 Å and about 500 Å, such as about 400 Å. Additionally, the recessing may also remove any leftover dielectric material located over the fins 113 to ensure that the fins 113 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized. All of the potential process steps are fully intended to be included within the scope of the present embodiment.

After the first isolation regions 111 have been formed, a dummy gate dielectric 115 and a dummy gate electrode 117 over the dummy gate dielectric 115 may be formed over each of the fins 113. In an embodiment the dummy gate dielectric 115 may be formed by thermal oxidation, chemical vapor deposition, sputtering, or any other methods known and used in the art for forming a gate dielectric. Depending on the technique of gate dielectric formation, the dummy gate dielectric 115 thickness on the top of the fins 113 may be different from the gate dielectric thickness on the sidewall of the fins 113.

The dummy gate dielectric 115 may comprise a material such as silicon dioxide or silicon oxynitride with a thickness ranging from about 3 angstroms to about 100 angstroms, such as about 10 angstroms. The dummy gate dielectric 115 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 115.

The dummy gate electrode 117 may comprise a conductive or non-conductive material and may be selected from a group comprising polysilicon, although any suitable materials or combination of materials may be utilized. The dummy gate electrode 117 may be deposited by chemical vapor deposition (CVD), sputter deposition, or other techniques known and used in the art for depositing conductive materials. The thickness of the dummy gate electrode 117 may be in the range of about 5 Å to about 200 Å. The top surface of the dummy gate electrode 117 may have a non-planar top surface, and may be planarized prior to patterning of the dummy gate electrode 117 or gate etch. Ions may or may not be introduced into the dummy gate electrode 117 at this point. Ions may be introduced, for example, by ion implantation techniques.

Once formed, the dummy gate electrode 117 may be patterned. The patterned dummy gate electrodes 117 define multiple channel regions located on each side of the fins 113 beneath the dummy gate dielectric 115. The patterned dummy gate electrodes 117 may be formed by depositing and patterning a gate mask 119 on the dummy gate electrode 117 using, for example, deposition and photolithography techniques known in the art. The gate mask 119 may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 117 may be etched using a dry etching process to form the patterned dummy gate electrodes 117.

FIGS. 2A-2D illustrate various cross-sectional views along the cut lines illustrated in FIG. 1. For example, FIG. 2A illustrates a cross-sectional view along line A-A of the first FinFET 107 (e.g., a "cut-on-fin" view) located within the core region 103 along the fins 113, while FIG. 2B illustrates a cross-sectional view along line B-B of the first FinFET 107 (e.g., a "cut-without-fin" view) along a cut adjacent to the fins 113. Similarly, FIG. 2C illustrates a cross-sectional view along line C-C of the second FinFET 108 (e.g., a "cut-on-fin" view) located within the I/O region 105, while FIG. 2D illustrates a cross-sectional view along line D-D (e.g., a "cut-without-fin" view) of the second FinFET 108 along a cut adjacent to the fins 113 located within the I/O region 105. In each of these figures, the substrate 101 has been removed for clarity.

Additionally, as can be seen in FIGS. 2A-2D, the widths of the dummy gate electrode 117 may be different in devices formed in the core region 103 and in devices formed in the I/O region 105. For example, in the core region 103, the dummy gate electrode 117 may have a first width $W_1$ of between about 50 Å and about 5000 Å, such as about 100 Å, while in the I/O region 105 the dummy gate electrode 117 may have a second width $W_2$ of between about 50 Å and about 5000 Å, such as about 300 Å. However, any suitable widths may be utilized.

FIGS. 3A-3D illustrate cross-sectional views along similar cut lines as FIGS. 2A-2D, and additionally illustrate the formation of a first spacer 301 and a second spacer 303 adjacent to the dummy gate electrodes 117 in the core region 103 and the I/O region 105. In an embodiment the material of the first spacer 301 may comprise a silicon-based material such as SiN, SiON, SiOCN, SiC, SiOC, $SiO_2$, SiC, or the like or may, in other embodiments, comprise a metal-based material such as SiGeO, SiAsO, $GeO_x$, $AsO_x$, SiP, SiPO, SiTiO, $TiO_x$, $CuO_x$, $CoO_x$, or the like, and may be formed to a thickness of between about 5 Å and about 500 Å. In an embodiment the first spacer 301 may be formed by initially using a deposition process such as physical vapor deposition, chemical vapor deposition, atomic layer deposition, a treatment such as oxidation, combinations of these, or the like. However, any suitable material, thickness, and method of formation may be utilized.

The second spacer 303 may be formed over the first spacer 301 and may be utilized to provide a different material with different etch characteristics from the first spacer 301. As such, the material of the second spacer 303 may be SiOCN in embodiments in which the first spacer 301 is SiN, although the second spacer 303 may in other embodiments be a silicon-based material such as SiN, SiON, SiC, SiOC, $SiO_2$, SiC, or the like or may, in other embodiments, comprise a metal-based material such as SiGeO, SiAsO, $GeO_x$, $AsO_x$, SiP, SiPO, SiTiO, $TiO_x$, $CuO_x$, $CoO_x$, or the like. In an embodiment the second spacer 303 may be formed using a deposition process such as physical vapor deposition, chemical vapor deposition, atomic layer deposition, combinations of these, or the like, to a thickness of between about 5 Å and about 500 Å. However, any suitable material, thickness, and method of formation may be utilized.

FIGS. 3A-3D additionally illustrate that, once the materials for the first spacer 301 and the second spacer 303 have been blanket deposited, the material of the first spacer 301 and the second spacer 303 may be patterned to form the first spacer 301 and the second spacer 303. In an embodiment the material of the first spacer 301 and the second spacer 303 are patterned using one or more anisotropic etching processes, such as reactive ion etches, in order to remove the first spacer 301 and the second spacer 303 from the horizontal surfaces of the structure. However, any suitable patterning process may be utilized.

Additionally, while only the first spacers 301 and the second spacers 303 are illustrated within FIGS. 3A-3D, embodiments are not limited to the presence of only two spacers. Rather, any suitable number of spacers may be formed adjacent to the dummy gate electrode 117. For example, the number of separate spacers with different materials may be between three spacers and ten spacers.

In an embodiment the patterning process of one or more anisotropic etching processes that are used to remove the first spacer 301 and the second spacer 303 from the horizontal surfaces of the structure may also be used to recess portions of the first isolation regions 111 that are exposed by the patterning process. As such, the first isolation regions 111 that are not covered by the patterned dummy gate electrodes 117 and the patterned first spacer 301 and the patterned second spacer 303 may be recessed to a level that is below the portion of the first isolation regions 111 that is covered, thereby forming a crown shape or fin shape within the first isolation regions 111. However, in other embodiments, the first isolation regions 111 are not recessed, and any suitable patterning of the first isolation regions 111 is fully intended to be included within the scope of the embodiments.

FIGS. 3A-3D additionally illustrate a removal of the fins 113 from those areas not protected by the patterned dummy gate electrodes 117, the first spacers 301 and the second spacers 303 and a regrowth of source/drain regions 305. The removal of the fins 113 from those areas not protected by the patterned dummy gate electrodes 117, the first spacers 301 and the second spacers 303 may be performed by a reactive ion etch (RIE) using the patterned dummy gate electrodes 117, the first spacers 301 and the second spacers 303 as hardmasks, or by any other suitable removal process. The removal may be continued until the fins 113 are either planar with (as illustrated) or below the surface of the first isolation regions 111.

In some embodiments the removal of the material of the fins 113 will be uneven between the core region 103 and the I/O region 105. For example, the removal of the material of the fins 113 within the I/O region 105 may proceed at an increased rate relative to the removal of the material of the fins 113 in the core region 103. As such, the openings formed by the removal will extend deeper in the I/O region 105 than in the core region 103. However, in other embodiments, the openings may extend to a similar depth.

Once these portions of the fins 113 have been removed, the source/drain regions 305 may be regrown in contact with each of the fins 113. In an embodiment the source/drain regions 305 may be regrown and, in some embodiments the source/drain regions 305 may be regrown to form a stressor that will impart a stress to the channel regions of the fins 113 located underneath the patterned dummy gate electrodes 117. In an embodiment wherein the fins 113 comprise silicon and the FinFET is a p-type device, the source/drain regions 305 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 305 may be formed to have a thickness of between about 5 Å and about 1000 Å and a height over the first isolation regions 111 of between about 10 Å and about 500 Å, such as about 200 Å. In this embodiment, the source/drain regions 305 may be formed to have a height above the upper surface of the first isolation regions 111 of between about 5 nm and about 250 nm, such as about 100 nm. Also, because of the uneven etching, the source/drain regions 305 in the I/O region 105 may have a larger height than the source/drain regions 305 in the core region 103. For example, the source/drain region 305 in the I/O region 105 may have a height of between about 200 Å and about 800 Å, such as about 500 Å, while the source/drain region 305 in the core region 103 may have a height of between 200 Å and about 800 Å, such as about 400 Å.

However, while specific dimensions and shaped have been described herein, these are intended to be illustrative and are not intended to be limiting. Rather, any suitable size and shape of the source/drain regions 305 may be utilized, and the size and shape may be affected by numerous parameters during the manufacturing process. For example, the size and shape of the source/drain regions 305 may be affected by the size and spacing of the gate stacks (e.g., differing gate stacks between the core region 103 and the I/O region 105 will cause different widths of their respective source/drain regions 305), the type of etching utilized to make room for the source/drain regions 305, the parameters utilized during the epitaxial growth of the source/drain regions 305, and the like. All such differences in parameters and their respective effects on the size and shape of the source/drain regions 305 are fully intended to be included within the scope of the embodiments.

Once the source/drain regions 305 are formed, dopants may be implanted into the source/drain regions 305 by implanting appropriate dopants to complement the dopants in the fins 113. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the patterned dummy gate electrodes 117, the first spacers 301 and the second spacers 303 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

FIGS. 4A-4D illustrate cross-sectional views along similar cut lines as FIGS. 2A-2D, and additionally illustrate deposition of a contact etch stop layer 401 and an inter-layer dielectric (ILD) layer 403 over the source/drain regions 305. The contact etch stop layer 401 is used to protect the underlying structures from damage caused by further processing and provide for a control point for further etching processes. In one embodiment, the contact etch stop layer 401 may be formed of silicon nitride using plasma enhanced chemical vapor deposition (PECVD), although other materials such as nitride, oxynitride, carbide, boride, combinations thereof, or the like, and alternative techniques of forming the contact etch stop layer 401, such as low pressure CVD (LPCVD), PVD, or the like, could alternatively be used. The contact etch stop layer 401 may have a thickness of between about 50 Å and about 2,000 Å, such as about 200 Å.

The ILD layer 403 may comprise a material such as boron phosphorous silicate glass (BPSG), although any suitable dielectrics may be used. The ILD layer 403 may be formed using a process such as PECVD, although other processes, such as LPCVD, may alternatively be used. The ILD layer 403 may be formed to a thickness of between about 100 Å and about 3,000 Å.

FIGS. 4A-4D additionally illustrate that, once the ILD layer 403 has been formed, the ILD layer 403 and the contact etch stop layer 401 may be planarized with the first spacers 301, the second spacers 303, and the dummy gate electrode 117. In an embodiment the ILD layer 403, the contact etch stop layer 401, the first spacers 301 and the second spacers 303 may be planarized using, e.g., a planarization process such as chemical mechanical polishing process, although any suitable process may be utilized. The planarization process is also utilized to remove the gate mask 119.

FIGS. 5A-5D illustrate cross-sectional views along similar cut lines as FIGS. 2A-2D, and additionally illustrates a removal of the dummy gate electrode 117 in both the core region 103 and the I/O region 105. In an embodiment the dummy gate electrodes 117 may be removed using, e.g., one or more wet or dry etching processes that utilize etchants that are selective to the materials of the dummy gate electrode 117. However, any suitable removal process or processes may be utilized.

FIGS. 5A-5D additionally illustrate that, once the dummy gate electrode 117 has been removed from both the core region 103 and the I/O region 105, a mask 501 may be placed over the structures within the I/O region 105 in order to protect the structures within the I/O region 105. In an embodiment the mask 501 may be a photosensitive material such as a polymer based photoresist that is dispensed and then patterned using, e.g., an exposure and development process to protect the I/O region 105 while exposing the core region 103. However, any suitable material, such as hard mask materials, and any suitable process, such as a deposition and patterning process, may be utilized to form the mask 501.

Once the mask 501 has been formed and the structures within the I/O region 105 have been protected, FIGS. 5A-5B illustrate that, in the core region 103, the first spacer 301 is patterned in order to remove those portions of the first spacer 301 that are aligned along a sidewall of the second spacer 303 without removing those portions of the first spacer 301 that are covered by the second spacer 303 and to form first spacer remainders 503. In an embodiment the patterning of the first spacer 301 may be performed using, e.g., one or more etching processes, such as chemical etching, plasma etching, wet cleaning, combinations of these, or the like, using an etchant that is selective to the material of the first spacer 301 without significantly etching the material of the second spacer 303.

In an embodiment the removal process to form the first spacer remainders 503 fully removes the first spacer 301 from adjacent the sidewalls of the second spacers 303, such that the first spacer remainders 503 are coterminous and aligned with a sidewall of the second spacers 303. As such, the first spacer remainders 503 may have a width that is equal to the deposited thickness of the second spacers 303 (e.g., between 5 Å and 500 Å). However, in other embodiments the first spacer 301 may remain adjacent to the sidewalls of the second spacers 303 (but with a reduced thickness) or else may be etched such that the first spacer remainders 503 are recessed in a direction parallel with a top surface of the fin 113.

By removing portions of the first spacers 301 and forming the first spacer remainders 503, the number of spacers located within the core region 103 ("a") may be reduced to be below the number of spacers located within the I/O region 105 ("b") such that b−a≥1. Additionally, the thickness of the combination of spacers (e.g., the second spacers 303 along with the first spacers 301), can be reduced for those structures within the core region 103 (e.g., 5 Å-5,000 Å) without reducing the thickness of the combination of spacers within the I/O region 105 (e.g., 10 Å-1,000 Å). As such, the capacitance and leakage risk can be reduced in the I/O region 105, which operates with a larger voltage, without degrading the performance of the devices located within the core region 103.

Additionally, in some embodiments the patterning of the first spacers 301 and the formation of the first spacer remainders 503 may also remove a portion of the first isolation region 111 located within the core region 103 under the dummy gate electrode 117. In embodiments the first isolation region 111 may be removed such that a recess 505 is formed with a curved, concave surface of the first isolation region 111 without a corresponding recess being formed within the I/O region 105 (because the I/O region 105 is still protected by the presence of the mask 501). In an embodiment the recess 505 may be formed with a first depth $D_1$ of between about 3 Å and about 500 Å, such as about 30 Å, and may have the first width $W_1$. However, any suitable dimensions may be utilized.

FIGS. 6A-6D illustrate cross-sectional views along similar cut lines as FIGS. 2A-2D, and additionally illustrate a removal of a portion of the dummy gate dielectric 115 in the core region 103. Such a removal forms dummy gate dielectric remainders 601 within the core regions 103 but also, through the presence of the mask 501 (see FIGS. 5C-5D), the dummy gate dielectric 115 is untouched by the process and remains intact within the I/O region 105. In an embodiment the dummy gate dielectric 115 may be patterned using, for example, one or more etching processes, such as chemical etching, plasma etching, wet cleaning, combinations of these, or the like, using an etchant that is selective to the material of the dummy gate dielectric 115 without significantly etching the material of the second spacer 303 or the first spacer remainders 503.

In an embodiment the removal process to form the dummy gate dielectric remainders 601 removes the material of the dummy gate dielectric 115 such that the dummy gate dielectric remainders 601 are coterminous and aligned with a sidewall of the second spacers 303 and/or the first spacer remainders 503. As such, the dummy gate dielectric remainders 601 may have a width that is equal to the deposited thickness of the second spacers 303 (e.g., between 5 Å and 500 Å). However, in other embodiments the dummy gate dielectric remainders 601 may be etched such that the dummy gate dielectric remainders 601 are recessed in a direction parallel with a top surface of the fin 113.

FIGS. 6C-6D additionally illustrate that, once the dummy gate dielectric remainders 601 have been formed, the mask 501 may be removed to expose the I/O region 105 for further processing. In an embodiment in which the mask 501 is a photoresist, the mask 501 may be removed using an ashing process, whereby a temperature of the mask 501 is increased to induce a thermal decomposition of the photoresist, after which the decomposed material may be easily removed. However, in other embodiments, etching processes may be utilized to remove the mask 501 and any suitable removal process may be utilized.

FIGS. 7A-7D illustrate cross-sectional views along similar cut lines as FIGS. 2A-2D, and additionally illustrate a formation of a first gate stack 701 within the region left behind by the removal of the dummy gate electrode 117. In an embodiment the process to form the first gate stack 701, may be begun by depositing a series of layers. In an embodiment the series of layers may include an interfacial layer, a first dielectric material, a first metal material, and a first p-metal work function layer (each of which is not separately illustrated in FIGS. 7A-7D for clarity).

Optionally, the interfacial layer may be formed prior to the formation of the first dielectric material. In an embodiment the interfacial layer may be a material such as silicon dioxide formed through a process such as in situ steam generation (ISSG) or a deposition process such as chemical vapor deposition or atomic layer deposition. In another embodiment the interfacial layer may be a high-k material such as $HfO_2$, HfSiO, HfSiON, HfTaO, HfTiO, HfZrO, LaO, ZrO, $Ta_2O_5$, combinations of these, or the like, to a first thickness of between about 5 Å and about 20 Å, such as about 10 Å. In embodiments which utilize a deposition process, the interfacial layer may be formed conformably, while in embodiments in which ISSG is utilized the interfacial layer may be formed along the bottom of the opening without extending along the sidewalls.

Once the interfacial layer is formed, the first dielectric material may be formed as a capping layer over the interfacial layer. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a second thickness of between about 5 Å and about 200 Å, although any suitable material and thickness may be utilized.

Optionally, the first metal material or metal gate capping layer may be formed adjacent to the first dielectric material as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a third thickness of between about 5 Å and about 200 Å, although any suitable deposition process or thickness may be used.

The first p-metal work function layer may be formed adjacent to the first metal material and, in a particular embodiment, may be similar to the first metal material. For example, the first p-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer may be deposited using a deposition process such as atomic layer deposition, chemical vapor deposition, sputtering, or the like, to a fourth thickness of between about 5 Å and about 500 Å, although any suitable deposition process or thickness may be used.

Once the first p-metal work function layer has been formed, a first n-metal work function layer may be deposited. In an embodiment, the first n-metal work function layer may be a material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like, to a sixth thickness of between about 5 Å and about 5000 Å, such as about 30 Å. However, any suitable materials and processes may be utilized to form the first n-metal work function layer.

Within the first gate stacks 701 is also deposited a glue layer and a fill material. Once the first n-metal work function layer has been formed, the glue layer may be formed in order to help adhere the overlying fill material with the underlying first n-metal work function layer as well as provide a nucleation layer for the formation of the fill material. In an embodiment the glue layer may be a material such as titanium nitride or else may be a material similar to the first n-metal work function layer and may be formed using a similar process such as ALD to a seventh thickness of between about 10 Å and about 100 Å, such as about 50 Å. However, any suitable materials and processes may be utilized.

Once the glue layer has been formed, the fill material is deposited to fill a remainder of the opening using the glue layer. In an embodiment the fill material may be a material such as Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material may be deposited to a thickness of between about 1000 Å and about 2000 Å, such as about 1500 Å. However, any suitable material may be utilized.

FIGS. 7A-7D further illustrates that, after the fill material has been deposited to fill and overfill the opening, the materials may be planarized to form the first gate stack 701. In an embodiment the materials may be planarized using, e.g., a chemical mechanical polishing process, although any suitable process, such as grinding or etching, may be utilized. While not explicitly shown for clarity, the interfacial layer may be planar along a bottom surface of the first gate stack 701; the first dielectric material, the first metal material, the first p-metal work function layer, the first n-metal work function layer, and the glue layer may have a "U" shape; and the fill material may fill a remainder of the space of the first gate stack 701. However, any suitable shapes or combination of shapes may be utilized for the various layers of the first gate stack 701.

By forming the first gate stacks 701 as described, the first gate stack 701 within the core region 103 is in contact with each spacer (e.g., the second spacer 303 as well as the first spacer remainder 503). However, in the I/O region 105, the first gate stack 701 is in physical contact with the first spacer 301 but in which the first spacer 301 separates the second spacer 303 from the first gate stack 701.

Finally, FIGS. 7A-7D illustrate a formation of first contacts 703 to the source/drain regions 305. In an embodiment an opening is formed through the ILD layer 403 and the contact etch stop layer 401 to expose a portion of the source/drain region 305. Optionally, prior to formation of the first contact 703, a silicide contact may be formed. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

By patterning the spacers within the core region 103 without patterning the spacers within the I/O region 105, the capacitance between the first gate stacks 701 and their respective contacts may be tuned for the individual devices.

As such, capacitance issues related to the larger voltages applied to the devices in the I/O region 105 can be handled without requiring similar changes to devices within other regions, such as the core region 103. Accordingly, degradation of electrical performance and yield due to leakage current of these devices can be reduced or eliminated. Similarly, the process windows utilized between the first contacts 703 and the first gate stacks 701 can be increased.

In an embodiment the first contact 703 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the opening using a deposition process such as sputtering, chemical vapor deposition, electroplating, electroless plating, or the like, to fill and/or overfill the opening. Once filled or overfilled, any deposited material outside of the opening may be removed using a planarization process such as chemical mechanical polishing (CMP). However, any suitable material and process of formation may be utilized. Additionally, the first contact 703 may have a thickness of between about 5 Å and about 2000 Å.

Figures 8A, 8B:
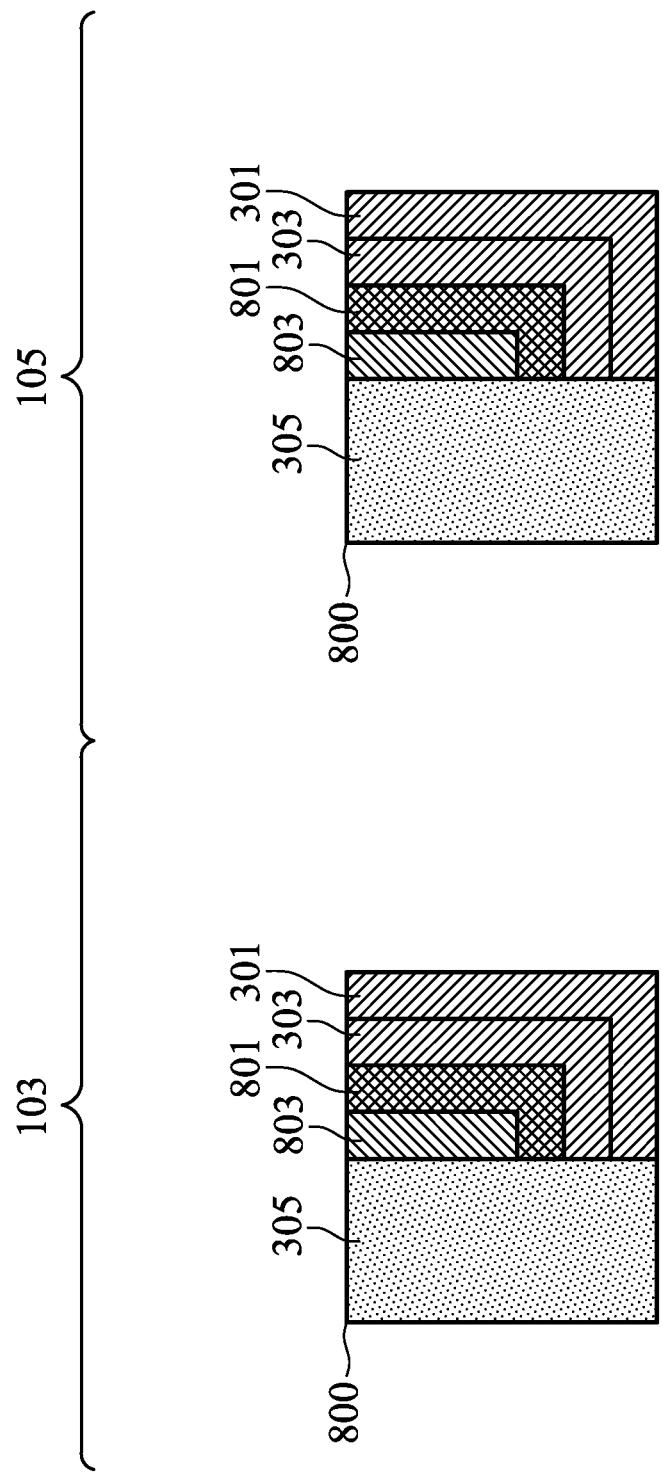
FIGS. 8A-8B illustrate formation of a four spacers, in accordance with some embodiments.

FIGS. 8A-8B illustrate another embodiment in which more than two spacers (e.g., more than the first spacer 301 and the second spacer 303) are utilized, wherein FIG. 8A illustrates a close-up view of the box labeled 800 in FIG. 3A and wherein FIG. 8B illustrates a close-up view of the box labeled 800 in FIG. 3C. In this embodiment, the first spacers 301 and the second spacers 303 are formed as described above with respect to FIGS. 3A-3D. However, in addition to the first spacer 301 and the second spacers 303, a third spacer 801 and a fourth spacer 803 are also formed.

In an embodiment the third spacer 801 may comprise a silicon-based material such as SiN, SiON, SiOCN, SiC, SiOC, $SiO_2$, SiC, or the like or may, in other embodiments, comprise a metal-based material such as SiGeO, SiAsO, $GeO_x$, $AsO_x$, SiP, SiPO, SiTiO, $TiO_x$, $CuO_x$, $CoO_x$, or the like and may be formed to a thickness of between about 5 Å and about 500 Å. In an embodiment the third spacer 801 may be formed by initially using a deposition process such as physical vapor deposition, chemical vapor deposition, a treatment such as oxidation, combinations of these, or the like. However, any suitable material, thickness, and method of formation may be utilized.

Once the third spacer 801 has been formed, the fourth spacer 803 may be formed over the third spacer 801. The fourth spacer 803 may be formed over the third spacer 801 and may be utilized to provide a different material with different etch characteristics from the third spacer 801. As such, the fourth spacer 803 may be silicon-based material such as SiN, SiON, SiOCN, SiC, SiOC, $SiO_2$, SiC, or the like or may, in other embodiments, comprise a metal-based material such as SiGeO, SiAsO, $GeO_x$, $AsO_x$, SiP, SiPO, SiTiO, $TiO_x$, $CuO_x$, $CoO_x$. In an embodiment the fourth spacer 803 may be formed using a deposition process such as physical vapor deposition, chemical vapor deposition, atomic layer deposition, combinations of these, or the like, to a thickness of between about 5 Å and about 500 Å. However, any suitable material, thickness, and method of formation may be utilized.

FIGS. 8A-8B additionally illustrate that, once the materials for the first spacer 301, the second spacer 303, the third spacer 801 and the fourth spacer 803 have been blanket deposited, the material of the first spacer 301, the second spacer 303, the third spacer 801 and the fourth spacer 803 may be patterned to form the first spacer 301, the second spacer 303, the third spacer 801 and the fourth spacer 803. In an embodiment the material of the first spacer 301, the second spacer 303, the third spacer 801 and the fourth spacer 803 are patterned using one or more anisotropic etching processes, such as reactive ion etches, in order to remove the first spacer 301, the second spacer 303, the third spacer 801 and the fourth spacer 803 from the horizontal surfaces of the structure. However, any suitable patterning process may be utilized.

As can be seen, after the patterning of the material of the first spacer 301, the second spacer 303, the third spacer 801 and the fourth spacer 803, each of the spacers (e.g., the first spacer 301, the second spacer 303, and the third spacer 801) except for the last deposited spacer (e.g., the fourth spacer 803) has an "L" shape to it after the patterning process. Additionally, the last deposited spacer (e.g., the fourth spacer 803) does not have the "L" shape but, rather, has a vertical sidewalls in this view.

FIGS. 9A-9B illustrate a removal process which etches the first spacer 301 within the core region 103 and which forms the first spacer remainder 503 without etching the first spacer 301 within the I/O region 105 (such that there is a smaller number of spacers on devices in the core region 103 than on devices in the I/O region 105). In an embodiment the removal process may be performed as described above with respect to FIGS. 5A-5D, such as by protecting the I/O region 105 and using an anisotropic etching process to remove portions of the first spacers 301 while stopping on the second spacers 303. However, any suitable process may be utilized.

If desired, once the first spacer remainder 503 has been formed, the first gate stacks 701 may be formed adjacent to the first spacer remainder 503 and the second spacer 303 (within the core region 103) and adjacent to the spacers (e.g., the first spacers 301, the second spacers 303, the third spacers 801, and the fourth spacers 803) within the I/O region 105. In an embodiment the first gate stacks 701 may be formed as described above with respect to FIGS. 7A-7D. However, any suitable materials and processes may be utilized.

If the first gate stack 701 is not formed at this time, FIGS. 10A-10B illustrate another removal process which etches the second spacer 303 and forms second spacer remainders 1001. In an embodiment the removal process to form the first spacer remainders 503 fully removes the second spacer 303 from adjacent the sidewalls of the third spacers 801 while stopping on the third spacers 801, such that the second spacer remainders 1001 are coterminous and aligned with a sidewall of the third spacers 801. However, in other embodiments the second spacer 303 may remain adjacent to the sidewalls of the third spacers 801 (but with a reduced thickness) or else may be etched such that the second spacer remainders 1001 are recessed in a direction parallel with a top surface of the fin 113.

By forming the second spacer remainders 1001 in the core region 103, a width of the second spacer remainders 1001 may be equal to a width of the third spacers 801 ($\text{width}_{second\ spacer\ remainder} - \text{width}_{third\ spacer} = 0$), while a width of the third spacers 801 may be larger than a width of the fourth spacer ($\text{width}_{third\ spacer} - \text{width}_{fourth\ spacer} > 0$). However, in the I/O region, wherein there has been no patterning of the spacers, the width of each spacer is larger than the width of a later deposited, overlying spacer ($\text{width}_{lower\ spacer} - \text{width}_{upper\ spacer} > 0$). However, any suitable widths may be utilized.

Again, if desired at this stage of manufacture, once the second spacer remainders 1001 has been formed, the first gate stacks 701 may be formed adjacent to the first spacer remainder 503 and the second spacer remainders 1001 (within the core region 103) and adjacent to the spacers (e.g., the first spacers 301, the second spacers 303, the third spacers 801, and the fourth spacers 803) within the I/O region 105. In an embodiment the first gate stacks 701 may be formed as described above with respect to FIGS. 7A-7D. However, any suitable materials and processes may be utilized.

If the first gate stack 701 is not formed at this time, FIGS. 11A-11B illustrate another removal process which etches the third spacer 801 and forms third spacer remainders 1101. In an embodiment the removal process to form the third spacer remainders 1101 fully removes the third spacer 801 from adjacent the sidewalls of the fourth spacers 803, such that the third spacer remainders 1101 are coterminous and aligned with a sidewall of the fourth spacers 803. However, in other embodiments the third spacer 801 may remain adjacent to the sidewalls of the fourth spacers 803 (but with a reduced thickness) or else may be etched such that the third spacer remainders 1101 are recessed in a direction parallel with a top surface of the fin 113.

By forming a plurality of spacers (e.g., the first spacers 301, the second spacers 303, the third spacers 801, and the fourth spacers 803) and then sequentially etching at least some of these spacers (e.g., the first spacers 301, the second spacers 303, and the third spacers 801) a pile of spacers 1103 is formed from the remains of the multi-layers spacers after the spacer removal, wherein the pile of spacers 1103 comprises the fourth spacers 803, the third spacer remainders 1101, the second spacer remainders 1001, and the first spacer remainders 503. In this embodiment, the remainders located on the bottom of the pile of spacers 1103 (e.g., the third spacer remainders 1101, the second spacer remainders 1001, and the first spacer remainders 503) may have a thickness that is the same as the material when it was original deposited, while the top of the pile of spacers (e.g., the unetched fourth spacer 803) has a much larger thickness in the same direction, such as having a thickness of between about 5 Å and about 500 Å, such as about 50 Å. If this thickness, or the thickness of the pile of spacers 1103 is too thin, then the operating voltage window cannot be enlarged, while if this thickness, or the thickness of the pillar of spacers 1103 are to large, then there will be an impact to the transistor density, causing fewer transistors to be included in the same surface area.

Once the pile of spacers 1103 has been formed, the first gate stacks 701 may be formed adjacent to the pile of spacers 1103 (within the core region 103) and adjacent to the spacers (e.g., the first spacers 301, the second spacers 303, the third spacers 801, and the fourth spacers 803) within the I/O region 105. In an embodiment the first gate stacks 701 may be formed as described above with respect to FIGS. 7A-7D. However, any suitable materials and processes may be utilized.

Additionally, while the first gate stacks 701 are described as being formed only after the last deposited gate spacer has been exposed (e.g., after the third spacer remainders 1101 have been formed), this is intended to illustrative and is not intended to be limiting to the embodiments. Rather, the first gate stacks 701 may be formed at any point after the formation of the first spacer remainders 503, such as prior to the formation of the second spacer remainders 1001 or prior to the formation of the third spacer remainders 1101. Any suitable combination of spacers and spacer remainders may be utilized to modify the capacitance between the first gate stack 701 and the first contacts 703.

Figure 12B:
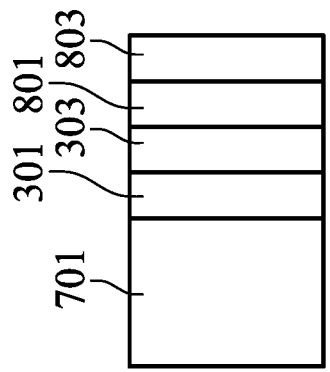
FIGS. 12A-12B illustrate a patterning of a single spacer, in accordance with some embodiments.
Figure 12A:
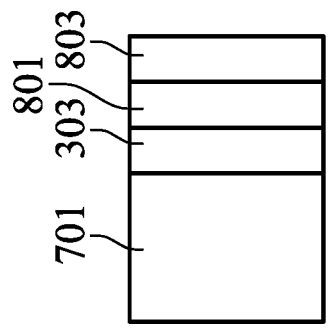

For example, FIGS. 12A-12B illustrates additional embodiments of combinations of spacers that can be utilized with FIG. 12A illustrating an embodiment at a location highlighted in FIG. 7A by the dashed box labeled 1200 in the core region and FIG. 12B illustrating an embodiment at a location highlighted in FIG. 7C by the dashed box labeled 1200. In an embodiment the fourth spacer 803 is formed of $SiON_x$, the third spacer 801 is formed of $SiN_x$, the second spacer 303 is formed of SiOCN, and the first spacer 301 is formed of $SiO_2$. Further, in the core region 103 but not in the I/O region 105, at least a portion of the first spacer 301 is removed such that the first gate stack 701 is formed adjacent to the second spacer 303.

Figure 13B:
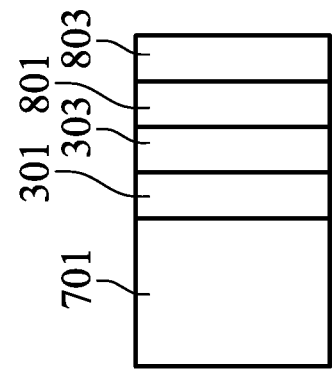
FIGS. 13A-13B illustrate a patterning of two spacers, in accordance with some embodiments.
Figure 13A:
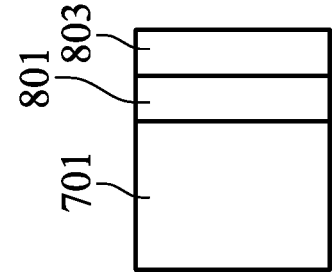

FIGS. 13A-13B illustrates a similar embodiment as FIGS. 12A-12B, wherein FIG. 13A illustrates an embodiment at a location highlighted in FIG. 7A by the dashed box labeled 1200 in the core region and FIG. 13B illustrating an embodiment at a location highlighted in FIG. 7C by the dashed box labeled 1200. In this embodiment, similar to the embodiments described with respect to FIGS. 12A-12B, the fourth spacer 803 is formed of $SiON_x$, the third spacer 801 is formed of $SiN_x$, the second spacer 303 is formed of SiOCN, and the first spacer 301 is formed of $SiO_2$. In this embodiment, however, not only is the first spacer 301 etched, but the second spacer 303 is also etched and patterned. As such, in the core region 103 but not in the I/O region 105, at least a portion of the first spacer 301 and the second spacer 303 are removed such that the first gate stack 701 is formed adjacent to the third spacer 801.

In an embodiment, a semiconductor device includes: a substrate comprising a first fin in a first region and a second fin in a second region; a first gate stack over the first fin and a second gate stack over the second fin; a first plurality of spacers adjacent to the first gate stack, the first plurality of spacers having a first width, wherein at least two spacers of the first plurality of spacers have a sidewall in physical contact with the first gate stack; and a second plurality of spacers adjacent to the second gate stack, the second plurality of spacers having a second width larger than the first width, wherein a first one of the second plurality of spacers separates the second gate stack from each other spacer within the second plurality of spacers. In an embodiment, the first one of the second plurality of spacers has an "L" shaped structure. In an embodiment, each one of the first plurality of spacers has the first width. In an embodiment, the first plurality of spacers comprises at least three spacers and wherein each spacer within the first plurality of spacers has a sidewall in physical contact with the first gate stack. In an embodiment, the second one of the second plurality of spacers has the first width. In an embodiment, the semiconductor device further includes: a first gate dielectric located between the first plurality of spacers and the first fin, the first gate dielectric having the first width; and a second gate dielectric located between the second gate stack and the second fin. In an embodiment, the first region is a core region and the second region is an I/O region, wherein the first plurality of spacers have different layers than the second plurality of spacers, and wherein the first gate stack is connected to a first voltage source and the second gate stack is connected to a second voltage source different from the first voltage source.

In another embodiment, a semiconductor device includes: a pile of spacers adjacent to a first gate stack over a first semiconductor fin, wherein each spacer within the pile of spacers has a width that is no greater than a top spacer within the pile of spacers, the pile of spacers having a first width and being located in a core region of a semiconductor substrate; and a first plurality of spacers adjacent to a second gate stack over a second semiconductor fin, at least one of the first plurality of spacers having an "L" shape, the first plurality of spacers having a second width larger than the first width. In an embodiment each material located within the first plurality of spacers can also be located within the pile of spacers. In an embodiment each spacer within the pile of spacers has the first width. In an embodiment at least one spacer within the pile of spacers is recessed from an adjacent spacer within the pile of spacers. In an embodiment the first gate stack has a width less than a width of the second gate stack. In an embodiment the semiconductor device further includes a shallow trench isolation adjacent to the first semiconductor fin, the first gate stack extending into a recess of the shallow trench isolation. In an embodiment the pile of spacers comprises at least four spacers.

In yet another embodiment a method of manufacturing a semiconductor device includes: depositing a first material adjacent to a first dummy gate electrode over a first semiconductor fin and adjacent to a second dummy gate electrode over a second semiconductor fin; depositing a second material adjacent to the first material; patterning the first material and the second material to form a first spacer and a second spacer adjacent to the first dummy gate electrode and a third spacer and a fourth spacer adjacent to the second dummy gate electrode; removing the first dummy gate electrode and the second dummy gate electrode; etching the first material of the first spacer to expose a sidewall of the second material of the second spacer and form a pile of spacers, the sidewall being perpendicular with a major surface of the first semiconductor fin, wherein the etching the first material does not etch the third spacer or the fourth spacer; forming a first gate electrode adjacent to the pile of spacers; and forming a second gate electrode adjacent to the third spacer. In an embodiment the method further includes: depositing a third material adjacent to the second material; and etching the second material to expose a sidewall of the third material and form the pile of spacers. In an embodiment the method further includes: depositing a fourth material adjacent to the third material; and etching the third material to expose a sidewall of the fourth material and form the pile of spacers. In an embodiment the method further includes: etching a first gate dielectric over the first semiconductor fin after the etching the first material without etching a second gate dielectric over the second semiconductor fin. In an embodiment the first semiconductor fin is located within a core region of a semiconductor substrate and the second semiconductor fin is located within an I/O region of the semiconductor substrate. In an embodiment the method further includes: recessing a shallow trench isolation region after the etching the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate comprising a first fin in a first region and a second fin in a second region;
   a first gate stack over the first fin and a second gate stack over the second fin;
   a first plurality of spacers adjacent to the first gate stack, the first plurality of spacers having a first width, wherein at least two spacers of the first plurality of spacers have a sidewall in physical contact with the first gate stack; and
   a second plurality of spacers adjacent to the second gate stack, the second plurality of spacers having a second width larger than the first width, wherein a first one of the second plurality of spacers separates the second gate stack from each other spacer within the second plurality of spacers.

2. The semiconductor device of claim 1, wherein the first one of the second plurality of spacers has an "L" shaped structure.

3. The semiconductor device of claim 1, wherein each one of the first plurality of spacers has the first width.

4. The semiconductor device of claim 1, wherein the first plurality of spacers comprises at least three spacers and wherein each spacer within the first plurality of spacers has a sidewall in physical contact with the first gate stack.

5. The semiconductor device of claim 1, wherein a second one of the second plurality of spacers has the first width.

6. The semiconductor device of claim 1, further comprising:
   a first gate dielectric located between the first plurality of spacers and the first fin, the first gate dielectric having the first width; and
   a second gate dielectric located between the second gate stack and the second fin.

7. The semiconductor device of claim 1, wherein the first region is a core region and the second region is an I/O region, wherein the first plurality of spacers have different layers than the second plurality of spacers, and wherein the first gate stack is connected to a first voltage source and the second gate stack is connected to a second voltage source different from the first voltage source.

8. A semiconductor device comprising:
   a pile of spacers adjacent to a first gate stack over a first semiconductor fin, wherein each spacer within the pile of spacers has a width that is no greater than a top spacer within the pile of spacers, the pile of spacers having a first width and being located in a core region of a semiconductor substrate; and
   a first plurality of spacers adjacent to a second gate stack over a second semiconductor fin, at least one of the first plurality of spacers having an "L" shape, the first plurality of spacers having a second width larger than the first width.

9. The semiconductor device of claim 8, wherein each material located within the first plurality of spacers can also be located within the pile of spacers.

10. The semiconductor device of claim 8, wherein each spacer within the pile of spacers has the first width.

11. The semiconductor device of claim 8, wherein at least one spacer within the pile of spacers is recessed from an adjacent spacer within the pile of spacers.

12. The semiconductor device of claim 8, wherein the first gate stack has a width less than a width of the second gate stack.

13. The semiconductor device of claim 8, further comprising a shallow trench isolation adjacent to the first semiconductor fin, the first gate stack extending into a recess of the shallow trench isolation.

14. The semiconductor device of claim 8, wherein the pile of spacers comprises at least four spacers.

15. A semiconductor device comprising:
a first spacer adjacent to a first gate stack over a first semiconductor fin, the first spacer comprising:
   a first portion of a first material having a first surface facing away from the first gate stack; and
   a first portion of a second material different from the first material, the first portion of the second material having a second surface facing away from the first gate stack, the second surface being aligned with the first surface; and
a second spacer adjacent to a second gate stack over a second semiconductor fin, the second spacer comprising:
   a second portion of the first material having a third surface facing away from the second gate stack; and
   a second portion of the second material, the second portion of the second material having an "L" shape, the second portion of the second material having a fourth surface facing away from the second gate stack, the third surface being aligned with the fourth surface.

16. The semiconductor device of claim 15, wherein the first portion of the first material has a first width and the first portion of the second material has the first width.

17. The semiconductor device of claim 16, wherein the first spacer further comprises a first portion of a third material, the first portion of the third material having a fifth surface facing away from the first gate stack, the fifth surface being aligned with the first surface.

18. The semiconductor device of claim 17, wherein the first spacer further comprises a first portion of a fourth material, the first portion of the fourth material having a sixth surface facing away from the first gate stack, the sixth surface being aligned with the first surface.

19. The semiconductor device of claim 15, wherein the first gate stack has a width less than a width of the second gate stack.

20. The semiconductor device of claim 15, wherein the first semiconductor fin is located within a core region of a semiconductor substrate and the second semiconductor fin is located within an I/O region of the semiconductor substrate.

* * * * *